Sept. 12, 1967 H. A. BERKHEISER 3,341,840

COMBINATION METRONOME AND PITCH TONE GENERATOR

Filed April 22, 1964

INVENTOR.

HERSCHELL A. BERKHEISER

BY

Townsend & Townsend

ATTORNEYS

United States Patent Office 3,341,840

Patented Sept. 12, 1967

3,341,840
COMBINATION METRONOME AND PITCH TONE GENERATOR

Herschell A. Berkheiser, Palo Alto, Calif.
(2275 Mora Way, Mountain View, Calif. 94040)

Filed Apr. 22, 1964, Ser. No. 361,675
2 Claims. (Cl. 340—384)

This invention relates to a device incorporating a novel electronic circuit for selectively generating either a series of metronomic pulses or a continuous tone of constant frequency for providing a tuning pitch tone.

The specific embodiments of the present invention which are described in more detail hereinbelow include an electronic circuit having a unijunction transistor as the sole active element together with a pair of RC circuits and a switch for selectively connecting one or the other of the RC circuits to the transistor to determine the frequency of oscillation of the transistor. An audio output connection is provided in one base lead of the transistor, and has the dual function of providing connection of a transducer for converting the electronic signals to audible signals and of establishing the sole direct current path between the battery and the remainder of the circuit so that the circuit can be de-energized by removal of the transducer from the audio output connection.

A principal object of the present invention is to provide a device for furnishing to the musician a fixed frequency tone of constant pitch to permit tuning of instruments and a metronomic signal of variable repetition rate in same compact unit. This object is realized by providing, in combination with a unijunction transistor, two RC circuits and a switch for selectively connecting one or the other circuits to the transistor. Since the parameters of the RC circuits determine the oscillating frequency of the unijunction transistor the frequency of oscillation can be readily changed to produce a tone or a series of periodic metronomic pulses.

The present invention has the feature and advantage of providing an electronic metronome in which the number of circuit elements is reduced to a minimum by use of a novel circuit to render it extremely compact and highly portable.

As a further feature and advantage of the present invention the audio output of the device is provided to an earphone in which the DC path from the battery to the remainder of the circuit is established through the earphone, so that the removal of the earphone de-energizes the circuit and renders a separate on-off switch unnecessary.

Other features and advantages include the provision of factory adjustable circuit elements which expedite manufacturing and assembling of the device, and a novel circuit for compensating for variations in the circuit parameters so that such variations will not affect the frequency of the standard tone generated by the apparatus of the invention.

Other objects, features and advantages will be more apparent after referring to the following specification and accompanying drawings in which.

Figure 1:
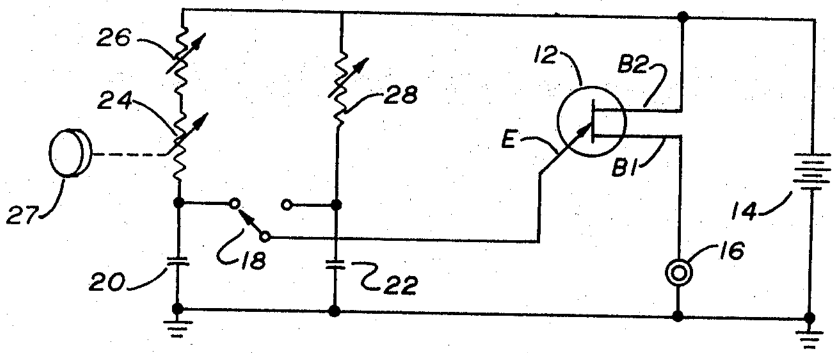
FIG. 1 is a schematic diagram of the electronic circuit of one embodiment of the present invention.

In FIG. 1 a unijunction transistor 12 has a base terminal B2 connected to the positive terminal of a battery 14 and has a base B1 connected to the negative terminal of battery 14 through a conventional two terminal jack 16. Transistor 12 has an emitter terminal selectively connectable by a single-pole double-throw switch 18 to a relatively large capacitor 20, i.e. 8 mfd. and to a relatively small capacitor 22, i.e. .02 mfd. In accordance with known transistor technology, when the voltage on the emitter E of transistor 12, i.e., the voltage charge across the capacitor 20 or 22 that is connected to the emitter, exceeds a particular voltage, a low resistance path between the emitter and base B1 is established; whereas when the voltage on the emitter is less than such value, a high resistance path exists between emitter E and base B1. Associated with each capacitor 20, 22 is a resistance path to the positive terminal of battery 14 establishing a charging circuit for the respective capacitors. In series between capacitor 20 and the positive terminal of battery 14 is a first variable resistor 24 and a second variable resistor 26. As will appear hereinafter, only resistor 24 is variable by the operator through a control knob 27, resistor 26 being pre-set during construction and alignment of the device. A third variable resistor 28 is provided in series between capacitor 22 and the positive terminal of battery 14 for charging the latter capacitor.

The operation of the circuit of FIGURE 1 may be understood by considering that battery 14 has charged both capacitors 20 and 22 up to the maximum state of charge. When the capacitors reach such state, no further current is drawn from the battery until an earphone is inserted into jack 16, thus establishing a DC return path to battery 14. With the return path so established and with switch 18 in the position shown in FIGURE 1, the potential across capacitor 20 and therefore the potential at emitter E of transistor 12 exceeds the voltage existing across the transistor bases B1 and B2 by an amount sufficient to establish a low resistance path from the emitter to base B1 and through an earphone connected to jack 16. Thus, current flows through the earphone and produces an audible tone. As the capacitor 20 discharges, the voltages across the junction between emitter E and base B1 decreases and the junction affords a high resistance discharge path, thereby permitting the capacitor to be recharged from battery 14 through resistors 24 and 26. When the voltage across the capacitor again reaches a level at which the junction between emitter E and base B1 is forward biased, the capacitor again discharges and another tone is heard in the earphones plugged into jack 16. The time constant of the RC circuit formed by resistor 24, resistor 26, and capacitor 20 is adjustable by changing the resistance of resistor 24; capacitor 20 has a sufficiently high capacitance that such time constant is of a duration to cause generation of metronomic pulses. "Metronomic pulses" in the present specification and claims means a series of periodic pulses having a repetition rate commonly used by musicians for metronomic purposes, such repetition rate being in the range of about 40 cycles per minute to about 208 cycles per minute.

With switch 18 in the opposite position from that shown in FIGURE 1, emitter E is connected to capacitor 22, a relative low capacitor compared with capacitor 20.

The charging and discharging of capacitor 22 through the transistor is identical to that described above with respective transistor 20, but the charging and discharging occurs at a much faster rate as a result of the relatively low value of capacitor 22. Thus, a continuous audio tone is created in the earphone in jack 16. The preferred freqency for such tone is 440 cycles per second, being the first A above middle C and also being the internationally accepted standard pitch frequency.

To provide the operating characteristics described next above I have constructed one circuit wherein the components have the following characteristics:

| | | |
|---|---|---|
| Transistor **12** | | 2N2646 |
| Battery **14** | volts | 9 |
| Capacitor **20** | microfarads | 8 |
| Capacitor **22** | do | .02 |
| Resistors **24** and **26** | | 100K |
| Resistor **28** | | 250K |

Figure 2:
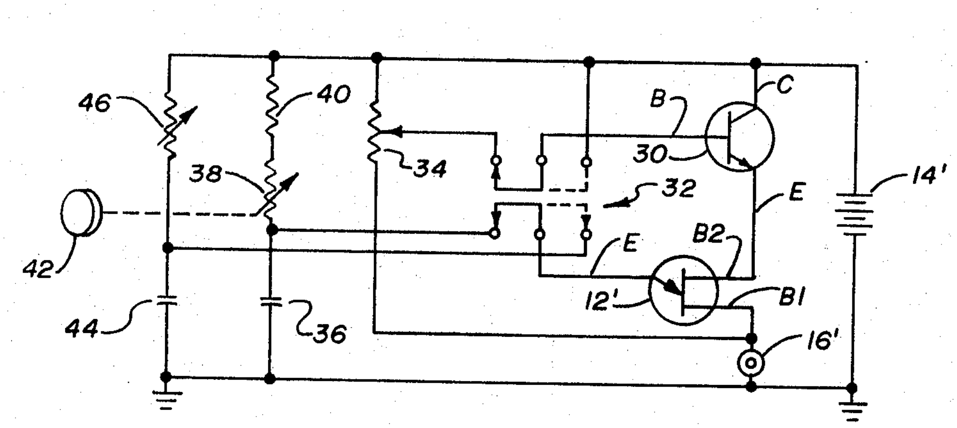
FIG. 2 is a schematic diagram of another embodiment of the electronic circuit of the present invention.

A circuit having somewhat higher and longer lasting stability is shown in FIGURE 2. The circuit of FIGURE 2 inclues a transistor 12' having a base B1 connected to the negative terminal of a battery 14' through a conventional two terminal jack 16'. Transistor 12' has a second base terminal B2 which is connected to the positive terminal of battery 14' through the emitter-collector junction of a second transistor 30. A double-pole double-throw switch 32 is provided for affording selection of either the metronome mode of operation or the pitch tone generation mode of operation. The base B of transistor 30 is alternately connected to the collector C of transistor 30 in the pitch tone mode of operation, and to a variable biasing resistor 34 in the metronome mode of operation. In the former position, of course, the transistor is ineffective since its input and output terminals are shorted. In the latter position, however, the condition of the collector-emitter circuit of transistor 30 depends upon the biasing on the base of that transistor as a consequence of which the biasing conditions on transistor 12' are maintained constant even though the output voltage of battery 14' may change or the other circuit parameters change as they age. It will be noted that the return path of the resistor 34 to the negative terminal of battery 14' is through jack 16' as a consequence of which the DC path is established only when an earphone is in place in jack 16'.

A first RC circuit for use in generating the metronome pulses is provided and includes a relatively large fixed capacitor 36 in series with a variable resistor 38 and a fixed resistor 40 connected to the positive terminal of battery 14'. A control knob 42 is provided on variable resistor 38 to permit the user of the device to select a desired metronomic pulse repetition rate. A second RC circuit comprising a relatively small capacitor 44 in series with a variable resistor 46 connected to the positive terminal of battery 14' is also provided for establishing a frequency of oscillation necessary to provide the pitch tone signal.

The circuit of FIGURE 2 is initially aligned by first setting switch 32 to the metronome position, shown in solid lines in the figure, and then by moving dial 42 to a central location, for example, 100 pulses per minute. A standard pulse repetition rate indicating instrument is connected to jack 16' and resistor 34 is adjusted until a pulse repetition rate of 100 pulses per minute is indicated on such instrument. Variable resistor 34 is then locked and the pulse repetition rate will be linearly variable in proportion to the rotative position of knob 42. Switch 32 is then moved to the pitch tone position, shown by broken lines in FIGURE 2, and resistor 46 is adjusted until the desired frequency, e.g. 440 cycles per second, is generated at the output through jack 16'. The apparatus is then ready for use, which use is conducted in a manner identical to that described above with respect to the circuit of FIGURE 1.

Figure 3:
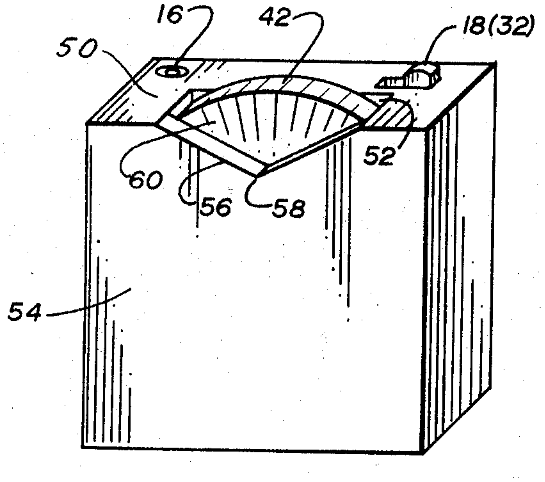
FIG. 3 is a prospective view of the novel case in which the circuitry is housed.

Referring now to FIGURE 3, a generally rectangular parallelepiped case is shown having a top wall 50 in which jack 16 and switch 18, or switch 32 as the case may be, are affixed and are accessible to the user from the exterior of the case. Top wall 50 includes a rectangular cutout portion 52 through which knob 42 extends for access to the user of the device. The case has a front wall 54 having a V-shaped cutout portion 56 therein adjacent to top edge thereof and of equal width to rectangular cutout 52 so that a portion of the forward face of knob 42 is visible to the user. The vertex 58 of the V-shaped cutout 56 affords an index point for setting the position of dial 42. Dial 42 is provided with a plurality of radially extending indicia 60, each indicium having a numeral designation for indicating the pulse repetition rate on the metronomic signal produced by the apparatus.

Because the adjustments afforded by resistors 26, 28, 34, and 46 are enclosed in the case, the operator need only make simple adjustments to secure maximum utilization and efficiency with the present device.

Thus, it will be seen that I have provided an improved, highly compact device wherein certain components perform dual functions to the end that the number of parts and therefore the size of the device is reduced to a minimum. Therefore, the device is extremely convenient to use as well as being economical to construct and manufacture. Contributing no small part to the compactness of the device is the fact that jack 16 serves as an on-off switch so that one need only remove an earphone plug from the jack to disable the device and prevent unwanted battery drain.

Although two embodiments of the present invention have been shown and described, it will be apparent that other adaptations and modifications may be made without departing from the true spirit and scope of the invention.

What is claimed is:

1. A combination metronome and tone generator comprising an electronic circuit for selectively generating in a first mode of operation a series of repetitive pulses having a repetition rate adjustable in the range of about 40 to 208 pulses per minute and in a second mode of operation an alternating current signal having a preselected frequency wtihin the audio range, a battery for energizing said circuit, means including a two terminal jack in series for connecting said battery to said circuit so that the connection is established only when a plug is in said jack, an earphone including a two terminal plug receivable in said jack for converting the signals generated by said electronic circuit to audible signals and for establishing connection from said battery to said electronic circuit, and a switch for effecting alternate selection between said first and second modes of operation.

2. A pocket size electronic combination metronome and tone generator comprising a case, an electronic circuit having a metronome mode of operation wherein a series of periodic pulses having a repetition rate adjustable in the range of 40 to 208 pulses per minute is generated and a tone mode of operation wherein a tone of preselected fixed frequency in the range of about 260 to 523 cycles per second is generated, a switch on the exterior of said case for selecting one of said modes of operation, an earphone having a two terminal plug for rendering audible the output of said electronic circuit, a battery in said case for energizing said electronic circuit, means for connecting said battery to said electronic circuit including a two terminal jack accessible from the exterior of said case in series between said battery and said electronic circuit, said connecting means being adapted to estblish a path between the battery and circuit only when said earphone plug is in place in said jack, and a rotatable knob accessible from the exterior of said case for adjusting the repetition rate of the metronome pulses produced by said circuit, said case having a wall defining a V-shaped cut-out portion through which said knob is accessible, said knob having a plurality of radial indicia for registration with the vertex of said V-shaped cut-out portion to permit preselected positiong of said knob.

References Cited

UNITED STATES PATENTS

| | | | |
|---|---|---|---|
| 2,570,875 | 10/1951 | Sink | 331—143 X |
| 2,810,069 | 10/1957 | Briskin et al. | 325—361 |
| 2,988,708 | 6/1961 | Schmidt | 331—111 |
| 3,173,107 | 3/1965 | Scharf et al. | 331—111 |

OTHER REFERENCES

Latner: "Transistorized Metronome," Popular Electronics, June 1961, pages 54, 55, 331–111.

Lederer: "Build a Unijunction Metronome," Radio-Electronics, July 1963, pages 40, 41; TK6540 R24. 331–111.

Singleton: "Pulse Generator Gives Low Frequency Output," Electronic Design, Jan. 20, 1964, pages 79, 81; TK7800.ES1 331–111.

ROY LAKE, *Primary Examiner.*

S. H. GRIMM, *Assistant Examiner.*